United States Patent

Okazaki et al.

[11] Patent Number: 5,773,200
[45] Date of Patent: Jun. 30, 1998

[54] POSITIVE RESIST COMPOSITION SUITABLE FOR LIFT-OFF TECHNIQUE AND PATTERN FORMING METHOD

[75] Inventors: Satoshi Okazaki; Kazuhiro Nishikawa; Masaru Kobayashi; Miki Kobayashi; Mitsuo Umemura, all of Usui-gun; Toshinobu Ishihara, Nakakubiki-gun, all of Japan

[73] Assignee: Shin-Etsu Chemical Co., Ltd., Tokyo, Japan

[21] Appl. No.: 573,578

[22] Filed: Dec. 15, 1995

Related U.S. Application Data

[62] Division of Ser. No. 493,612, Jun. 22, 1995, abandoned.

[30] Foreign Application Priority Data

Jun. 23, 1994 [JP] Japan .................................. 6-164634

[51] Int. Cl.⁶ .............................. G03F 7/38; G03F 7/42; G03F 7/023
[52] U.S. Cl. .......................... 430/324; 430/191; 430/327; 430/329; 430/330
[58] Field of Search ................................... 430/329, 330, 430/315, 324, 327, 191

[56] References Cited

U.S. PATENT DOCUMENTS

| | | |
|---|---|---|
| 4,284,706 | 8/1981 | Clecak et al. .............................. 430/329 |
| 4,659,650 | 4/1987 | Moritz et al. ............................. 430/329 |
| 5,120,622 | 6/1992 | Hanrahan .................................. 430/329 |
| 5,200,293 | 4/1993 | Schulz et al. ............................. 430/191 |
| 5,219,701 | 6/1993 | Schulz et al. ............................. 430/191 |
| 5,221,596 | 6/1993 | Keller ....................................... 430/329 |
| 5,225,310 | 7/1993 | Stahlhofen et al. ...................... 430/192 |
| 5,360,698 | 11/1994 | Hanrahan .................................. 430/329 |
| 5,413,896 | 5/1995 | Kajita et al. .............................. 430/192 |

*Primary Examiner*—John S. Chu
*Attorney, Agent, or Firm*—Millen, White, Zelano & Branigan, P.C.

[57] ABSTRACT

A positive resist composition contains (1) a novolak resin having a weight average molecular weight calculated as polystyrene of 2,000–10,000 as an alkali-soluble resin, (2) a low nucleus compound having a phenolic hydroxyl group and 2–5 benzene rings as a dissolution promoter, and (3) a compound having a 1,2-naphthoquinonediazidosulfonyl group in a molecule and a degree of esterification of at least 65% as a photosensitive agent. By forming a resist layer on a substrate from the positive resist composition, and baking the resist layer at 100°–130° C. before exposure or before development, followed by exposure and development, there is formed a resist pattern having a micro-groove of desired configuration. This resist pattern lends itself to a lift-off technique.

10 Claims, 5 Drawing Sheets

POSITIVE RESIST COMPOSITION SUITABLE FOR LIFT-OFF TECHNIQUE AND PATTERN FORMING METHOD

This application is a division of application Ser. No. 08/493,612, filed Jun. 22, 1995, now abandoned.

BACKGROUND OF THE INVENTION

1. Field of the Invention

This invention relates to a positive resist composition which lends itself to a lift-off technique. The composition allows a precise reliable conductor pattern to be formed by a lift-off technique and is advantageously used in forming conductor patterns such as aluminum electrodes on semiconductor substrates.

2. Prior Art

In the prior art, dry and wet etching processes are commonly used in forming conductor patterns such as aluminum electrodes on semiconductor substrates. The process is illustrated in FIG. 3 as comprising metal layer sputtering and resist patterning to form a resist pattern 3 on a metallization layer 2 on a substrate 1. The exposed portions of the metallization layer 2, that is, those metallization portions which are not covered with the resist pattern 3 are etched away. By treating the structure with a stripping solution, the resist pattern 3 is stripped off to leave a conductor pattern 2 on the substrate 1.

The above-mentioned process, however, suffers from low processing precision and a problem occurs with etching procedure where difficult-to-etch metals such as gold and tantalum are used for the metallization (see VSLI Seizo Gizyutsu (VSLI Manufacturing Technology), Nikkei BP K.K., 1989, page 259). To avoid such inconvenience, a lift-off technique is often used in these years. The lift-off technique is illustrated in FIG. 4 as comprising resist patterning to form a resist pattern 3 on a substrate 1, metal layer sputtering to form a metal layer 2 on the resist pattern 3 and substrate 1, and processing the structure with a stripping solution to strip or lift off the resist. A conductor pattern can be formed without an etching procedure. This lift-off technique ensures precision processing since a metal pattern is formed using a precisely configured resist pattern as a template. Even a difficult-to-etch metal can be readily processed due to the eliminated need for etching as long as it can be deposited on the substrate and resist layer. The resist stripping step plays the most important role in the lift-off technique. If the resist can be effectively stripped in this step without leaving residues, the lift-off technique is expected to accomplish improvements in processing precision and reliability.

However, where patterns are formed by the lift-off technique using conventional positive resist compositions, the resist stripping step does not effectively take place and can leave resist residues, giving rise to a problem of reliability.

In this regard, the most serious problem is illustrated by referring to FIG. 5. In the case of positive resist, there is formed a resist pattern 3 of forward taper on a substrate 1, as shown in FIG. 5-1. Upon metal sputtering, metal particles fly straight forward, but with certain anisotropy, and deposit as a metallization layer 2 on the side wall of the resist pattern 3 as well as on its top as shown in FIG. 5-2. In the subsequent resist stripping step, the metal deposit on the side wall can prevent the stripping solution to directly attack the resist pattern 3. Even if the metal deposit 2 on the side wall is thin and partially broken to allow the stripping solution to penetrate to the resist pattern 3, there remains the possibility that the resulting metal pattern 4 be inversely tapered, fins 5 project therefrom, and resist residues 6 be left as shown in FIG. 5-3.

In the field of positive photoresists, a micro-groove phenomenon is well known (see the 39th Applied Physics Related Union Meeting, Preprint No. 2, p. 517, 29p-NA-15, 1992, Spring). A micro-groove is depicted at 7 in FIGS. 1 and 2. It is a deformation of a resist pattern (or strip) 3 at its bottom. The resist pattern 3 is inwardly undercut at its interface with the substrate 1, resulting in an overhang structure. The micro-groove phenomenon occurs because the photosensitive agent decays or disappears at the bottom of the pattern which has not been exposed, allowing the bottom to be dissolved, that is, because of the improper distribution of a photosensitive agent concentration.

Once the micro-groove phenomenon occurs, the pattern cannot be used as a resist despite high resolution or the like. Therefore, it is an essential theme in the resist development efforts how to minimize the occurrence of micro-grooves by controlling the solubility of a micro-groove-susceptible resist.

Therefore, an object of the present invention is to provide a positive resist composition for use in a lift-off technique which can form a conductor pattern at high processing precision in a reliable manner. Another object of the present invention is to provide a method for forming a conductor pattern using the resist composition according to a lift-off technique.

SUMMARY OF THE INVENTION

According to a first aspect of the invention, there is provided a positive resist composition for use in a lift-off technique comprising in admixture (1) an alkali-soluble resin, (2) a dissolution promoter, and (3) a photosensitive agent. The alkali-soluble resin (1) is a novolak resin containing a recurring unit of the following general formula (1):

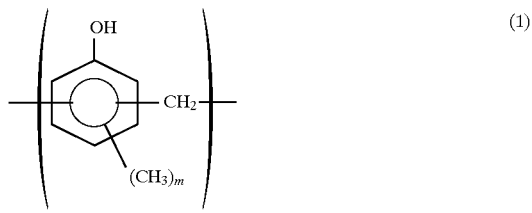

wherein m is an integer of 0 to 3, and having a weight average molecular weight calculated as polystyrene of 2,000 to 10,000. The dissolution promoter (2) is a low nucleus compound having a phenolic hydroxyl group and 2 to 5 benzene rings and represented by the following general formula (2) or (3):

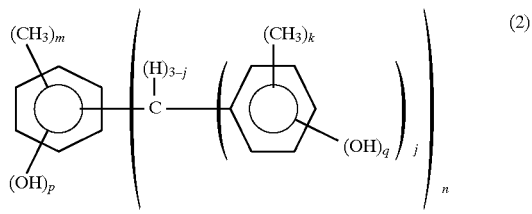

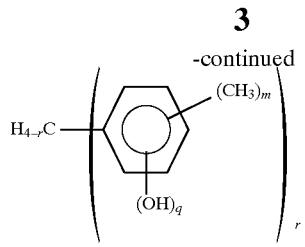

wherein j is 1 or 2, each of k, m and p is an integer of 0 to 3, n is an integer of 1 to 4, q is an integer of 1 to 3, r is an integer of 2 or 3, m+p+n≦6, and k+q≦5. The photosensitive agent (3) is a compound having a 1,2-naphthoquinonediazidosulfonyl group in a molecule and a degree of esterification of at least 65% and represented by the following general formula (4) or (5):

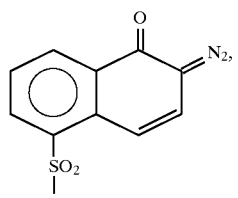

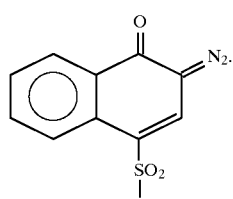

According to a second aspect, as exemplified by FIGS. 6-1 to 6-3, in a method for forming a pattern comprising the steps of forming a resist layer on one surface of a substrate 1, preferably from the positive resist composition defined above, processing the resist layer to form a resist pattern 3, metallizing the substrate surface including the resist pattern, and stripping off the resist pattern to leave a pattern of metallization 2 on the substrate, the resist layer constituting the resist pattern is formed with a micro-groove 7. Preferably, in a profile of the resist layer constituting the resist pattern as shown in FIGS. 1 and 2 wherein the resist layer has a line width of L μm and a thickness of T μm, and the micro-groove has a cut height of A μm and a cut depth of B μm, the resist layer has a thickness T of up to 20 μm and the micro-groove has an extent of cut defined by the equations (I) and (II):

$$1/20 \leq A/T \leq 2/5 \qquad (I)$$

$$1/10 \leq A/B \leq 2 \qquad (II)$$

More particularly, using the positive resist composition defined above, a resist layer is formed on one surface of a substrate. The resist layer is baked at a temperature of 100° to 130° C. before exposure or before development. The resist layer is exposed to light and then developed, thereby forming a resist pattern having a micro-groove of a predetermined configuration in the resist layer. This is quite advantageous for pattern forming by a lift-off technique.

More illustratively, according to the present invention, the micro-groove which was believed undesirable in the prior art is positively created in the resist layer. The intentionally micro-grooved resist pattern is applied to a lift-off technique which was believed incompatible with conventional positive resist compositions. The process is shown in FIG. 6 as comprising the steps of forming a resist pattern 3 having micro-grooves 7 on a substrate 1 from a positive resist composition according to the invention, sputtering or evaporating a metal to form a metallization layer 2, and stripping the resist. This process offers the following advantages.

(1) No metal adheres or deposits to the micro-grooves at the bottom of the resist pattern. Since the stripping solution can directly attack the resist pattern, the resist can be quickly stripped off within a certain time in an even manner.

(2) After metal deposition, the micro-grooves at the bottom of the resist pattern remain as empty spaces. No resist is left at the corner upon resist stripping.

(3) The finally obtained metal pattern is improved in rectangularity.

According to the invention, a precise, reliable wiring pattern can be formed by the lift-off technique without the above-mentioned problems.

BEST MODE FOR CARRYING OUT THE INVENTION

Figure 1:
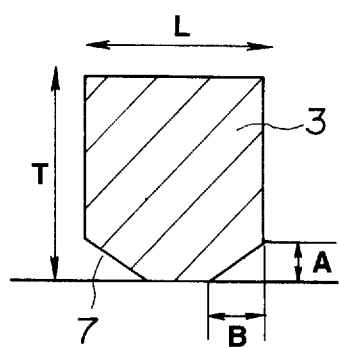
FIG. 1 is a schematic cross-section of one exemplary resist layer having a micro-groove formed therein.

According to the present invention, the positive resist composition which lends itself to a lift-off technique uses as an alkali-soluble resin (1) a novolak resin containing a recurring unit of the following general formula (1) and having a weight average molecular weight calculated as polystyrene of 2,000 to 10,000.

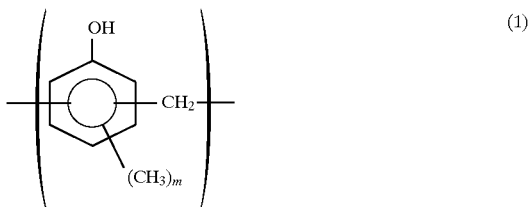

In formula (1), m is an integer of 0 to 3.

The novolak resins having a recurring unit of formula (1) can be synthesized by condensing at least one phenol of the following general formula (8):

wherein m is an integer of 0 to 3, typically o-cresol, m-cresol and p-cresol with an aldehyde in a conventional manner. Examples of the aldehyde include formaldehyde, paraformaldehyde, acetaldehyde, and benzaldehyde, with formaldehyde being preferred. The phenol of formula (8) and the aldehyde are preferably used in a molar ratio of from 0.3 to 2.

With respect to the average molecular weight of the alkali-soluble resin, it has a weight average molecular weight calculated as polystyrene of 2,000 to 10,000, especially 3,000 to 7,000. With a weight average molecular weight of less than 2,000, a resist film has heat resistance below the practically acceptable level. With a weight average molecular weight of more than 10,000, a resist film becomes low in resolving power.

A dissolution promoter (2) is a low nucleus compound having a phenolic hydroxyl group and 2 to 5 benzene rings and represented by the following general formula (2) or (3):

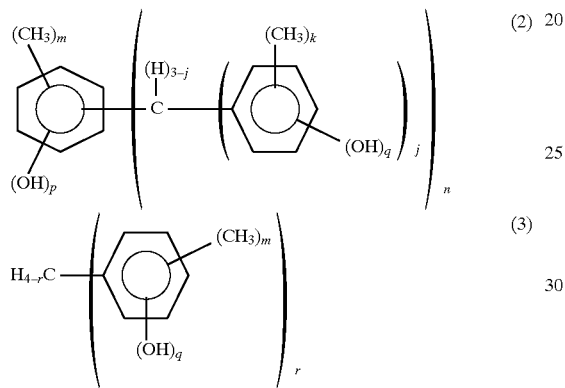

wherein j is 1 or 2, each of k, m and p is an integer of 0 to 3, n is an integer of 1 to 4, q is an integer of 1 to 3, r is an integer of 2 or 3, $m+p+n \leqq 6$, and $k+q \leqq 5$.

The low nucleus compound has 2 to 5 benzene rings. With less than two benzene rings, a resist film has very poor heat resistance. With more than five benzene rings, it is difficult to form a micro-groove.

Illustrative, non-limiting examples of the low nucleus compound are given below.

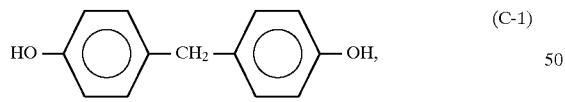
(C-1)

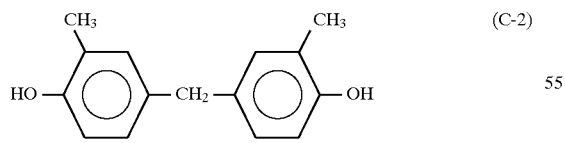
(C-2)

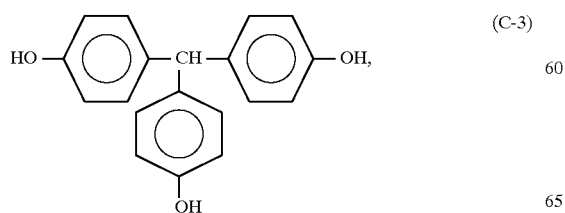
(C-3)

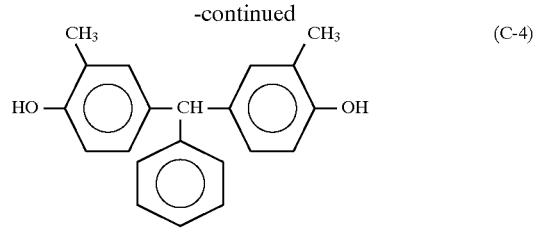
(C-4)

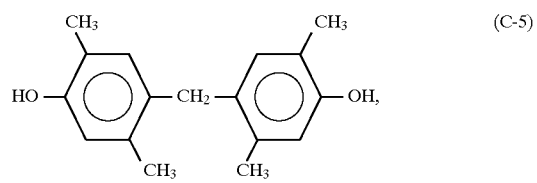
(C-5)

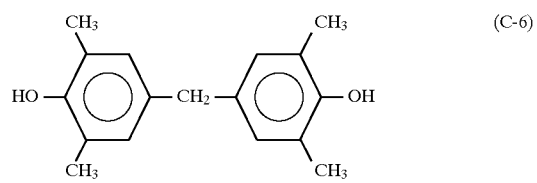
(C-6)

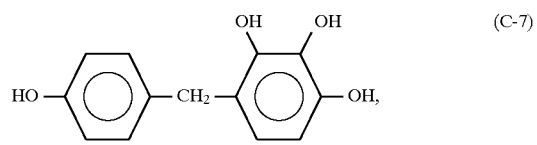
(C-7)

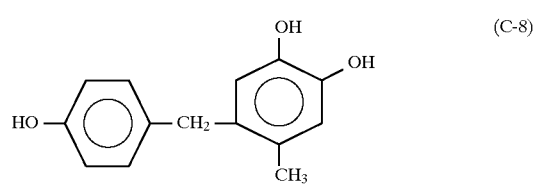
(C-8)

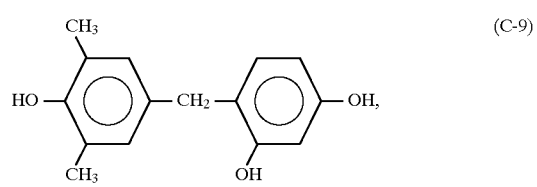
(C-9)

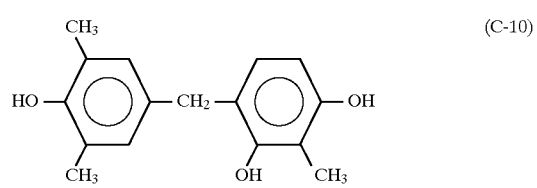
(C-10)

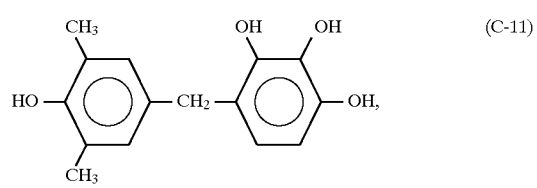
(C-11)

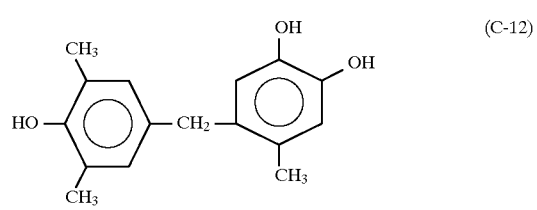
(C-12)

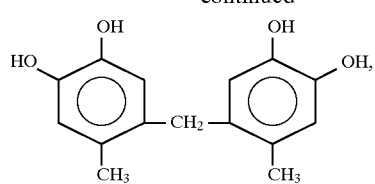 (C-13)
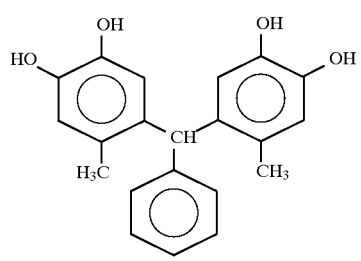 (C-14)
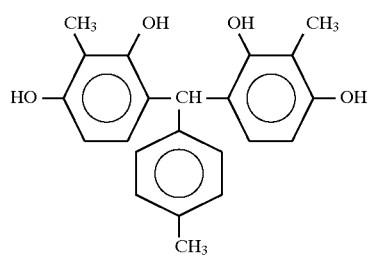 (C-15)
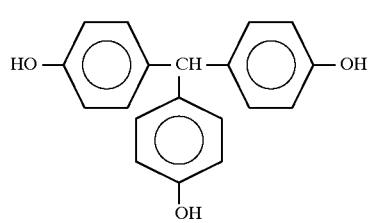 (C-16)
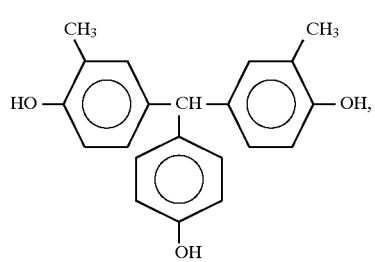 (C-17)
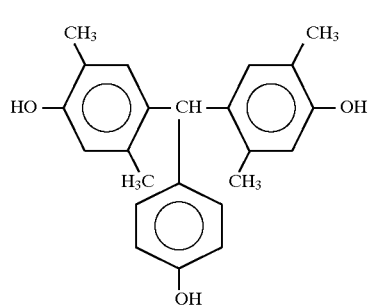 (C-18)
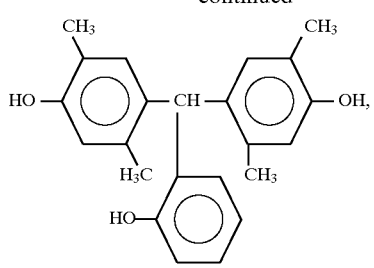 (C-19)
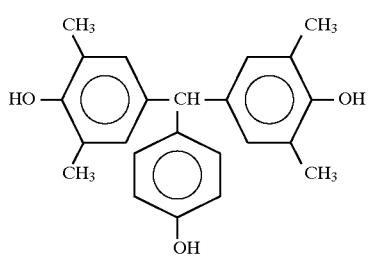 (C-20)
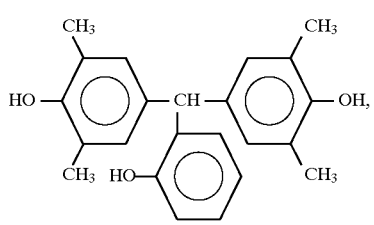 (C-21)
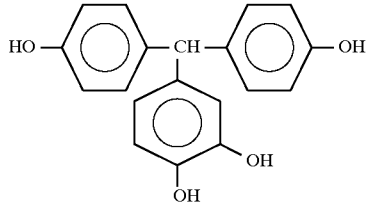 (C-22)
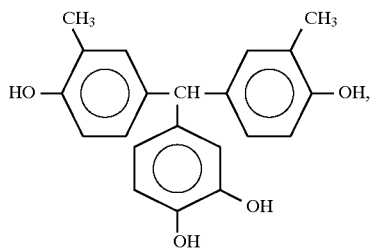 (C-23)
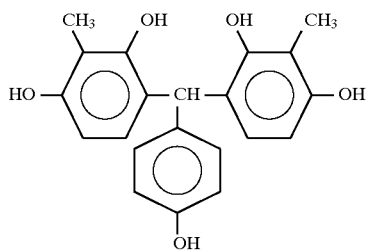 (C-24)

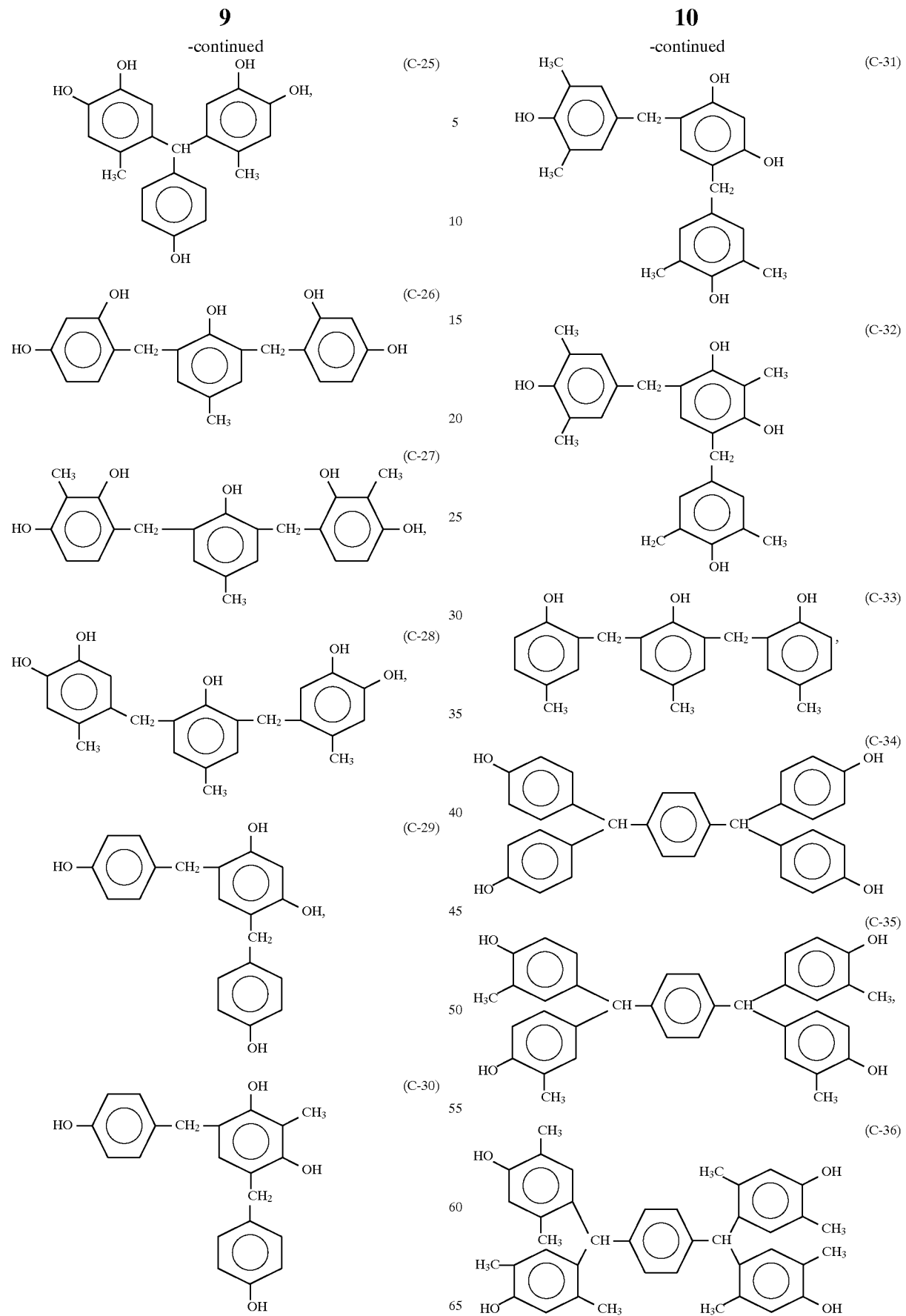

-continued

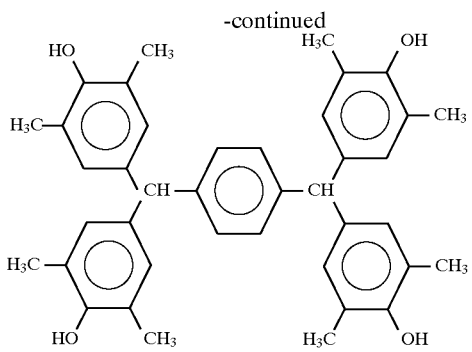
(C-37)

A photosensitive agent (3) is a compound represented by the following general formula (4) or (5) and having a 1,2-naphthoquinonediazidosulfonyl group in a molecule and a degree of esterification of at least 65%.

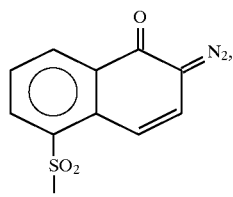
(4)

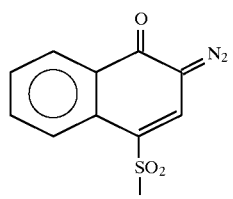
(5)

The compounds having a 1,2-naphthoquinonediazido group are obtained, for example, by introducing 1,2-quinonediazidosulfonyl chloride into a ballast molecule of the following general formula (6) or (7):

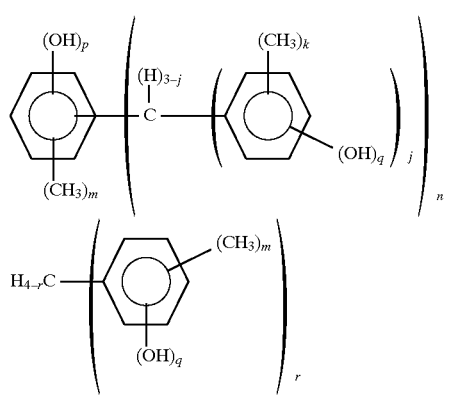

wherein j is 1 or 2, each of k, m and p is an integer of 0 to 3, n is an integer of 1 to 4, q is an integer of 1 to 3, r is an integer of 2 or 3, m+p+n≦6, and k+q≦5, or trihydroxybenzophenone or tetrahydroxybenzophenone.

For effective introduction, it is preferable to rely on dehydrochlorination condensation reaction between 1,2-naphthoquinonediazidosulfonyl chloride and a phenolic OH group in the presence of a basic catalyst. It is preferred to substitute 65% or more of the phenolic OH group of the ballast molecule of formula (6) or (7), tri- or tetrahydroxybenzophenone.

The compound having a 1,2-naphthoquinonediazidosulfonyl group in a molecule has a degree of esterification of at least 65%, preferably 66 to 100%. With a percent esterification of less than 65%, formation of micro-grooves is difficult.

In one preferred embodiment, the positive resist composition of the invention contains 80 parts by weight of the alkali-soluble resin, about 10 to 60 parts, especially about 20 to 40 parts by weight of the low nucleus compound of formula (2) or (3) having a phenolic hydroxyl group and 2 to 5 benzene rings, and about 15 to 60 parts, especially about 25 to 40 parts by weight of a compound of formula (4) or (5) having a 1,2-naphthoquinonediazidosulfonyl group and a degree of esterification of at least 65%.

On this basis, if the amount of the low nucleus compound blended is less than 10 parts, formation of micro-grooves would be sometimes difficult. If the amount of the low nucleus compound blended is more than 60 parts, a resist pattern would be dissolved away. If the amount of the compound having a 1,2-naphthoquinonediazidosulfonyl group is less than 15 parts, formation of micro-grooves would be sometimes difficult. If the amount of the compound having a 1,2-naphthoquinonediazidosulfonyl group is more than 60 parts, there would arise disadvantages of low sensitivity and scumming.

The present invention is also directed to a method for forming a metal pattern by a lift-off technique. A resist film is formed on one surface of a substrate from an appropriate resist composition, followed by exposure and development to form a predetermined resist pattern. A metallization layer of gold, tantalum or the like is then formed on the substrate surface (that is, on the resist pattern and that surface of the substrate where no resist pattern is formed) by suitable means such as evaporation and sputtering. An appropriate stripping solution is then applied to strip off the resist pattern, obtaining a predetermined metal pattern on the substrate. According to the feature of the invention, the resist layer constituting the resist pattern is formed with a micro-groove. Then the metallization layer is formed on the micro-grooved resist pattern, which is subsequently stripped off.

Figure 2:
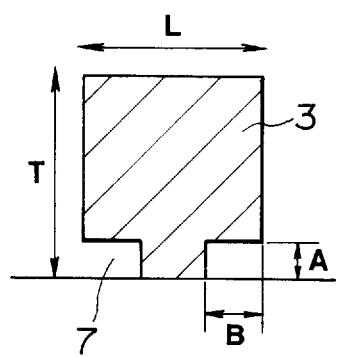
FIG. 2 is a schematic cross-section of another exemplary resist layer having a micro-groove formed therein.
Figure 3:
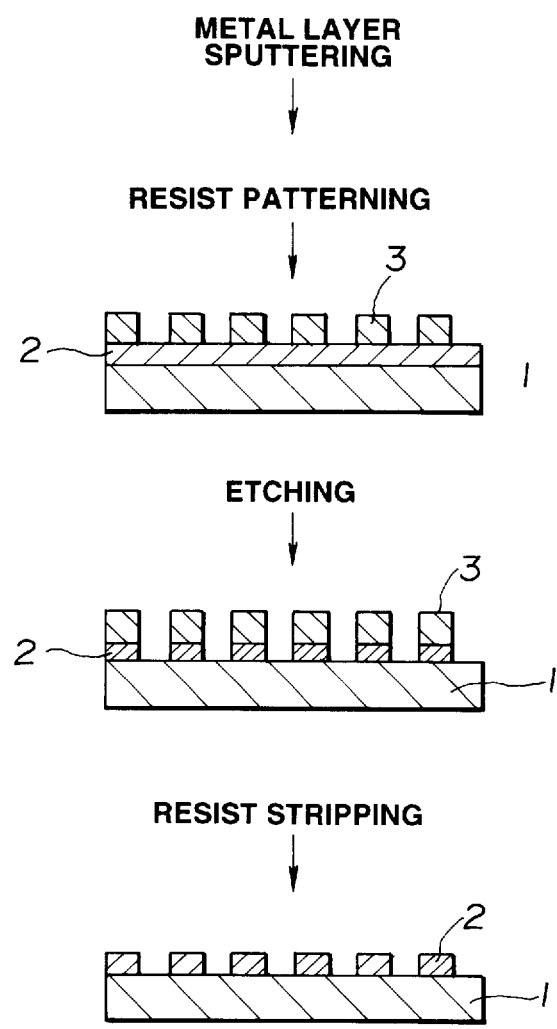
FIG. 3 schematically illustrates an etching process.
Figure 4:
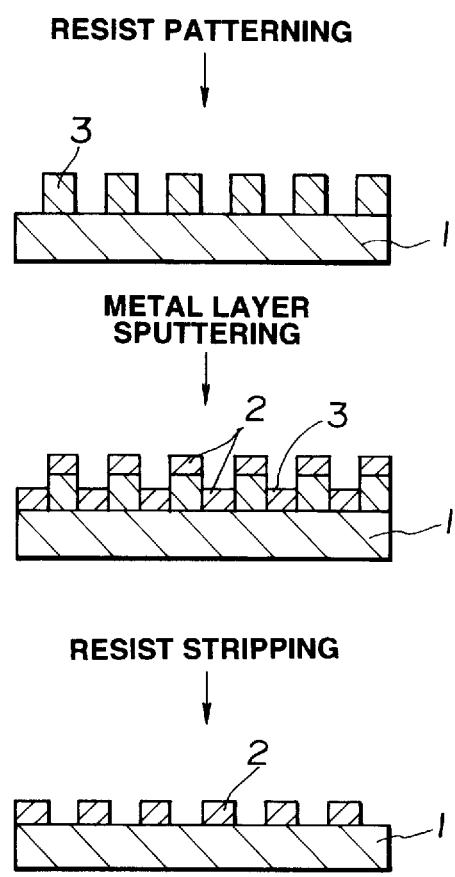
FIG. 4 schematically illustrates a resist pattern forming process by a lift-off technique.
Figure 5A:
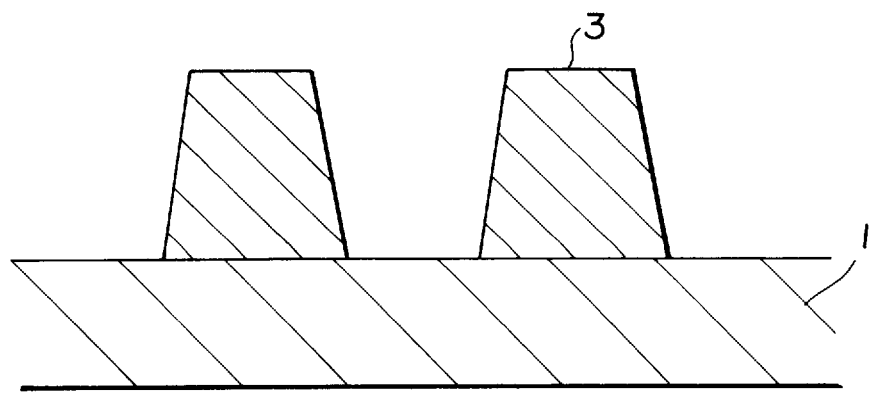
FIG. 5 schematically illustrates a resist pattern formed by a lift-off technique using a conventional positive resist composition.
Figure 5B:
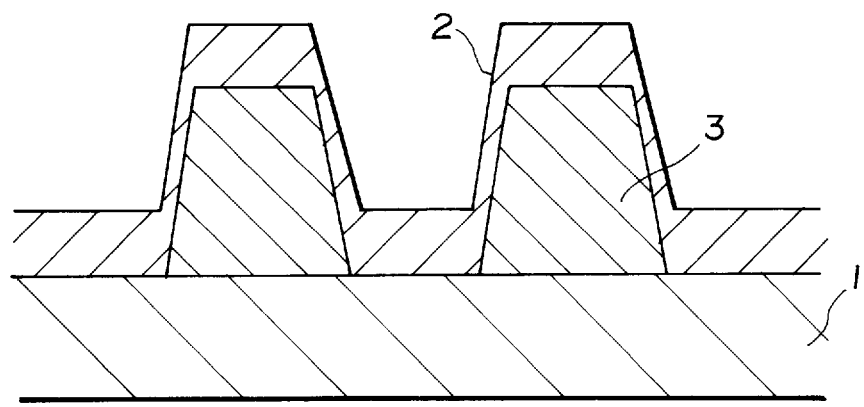
Figure 5C:
Figure 5C:
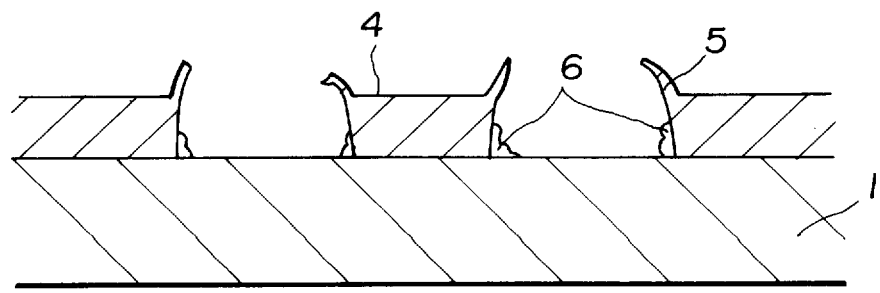
Figure 6A:
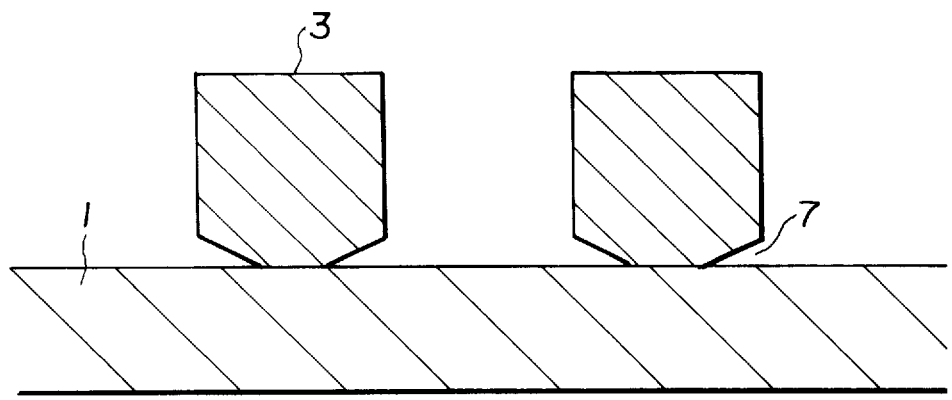
FIG. 6 schematically illustrates a resist pattern formed by a lift-off technique using an inventive positive resist composition.
Figure 6B:
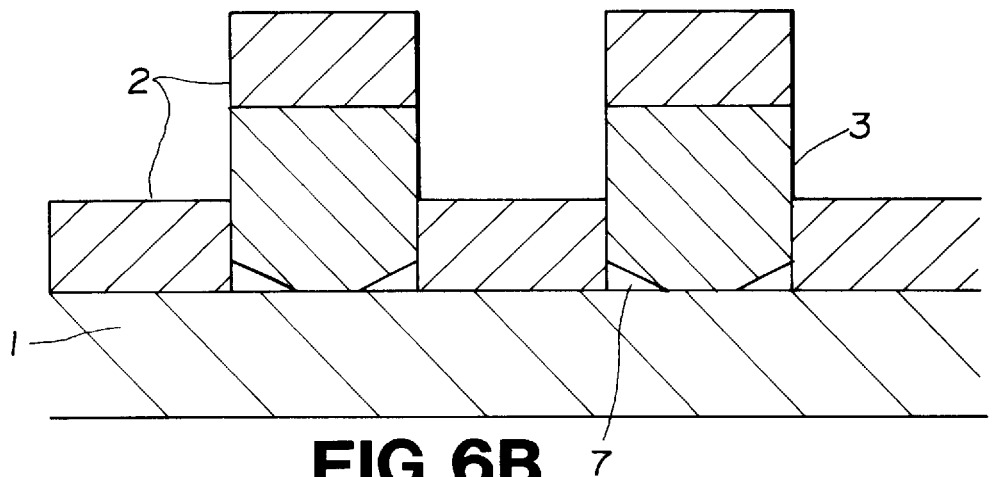
Figure 6C:
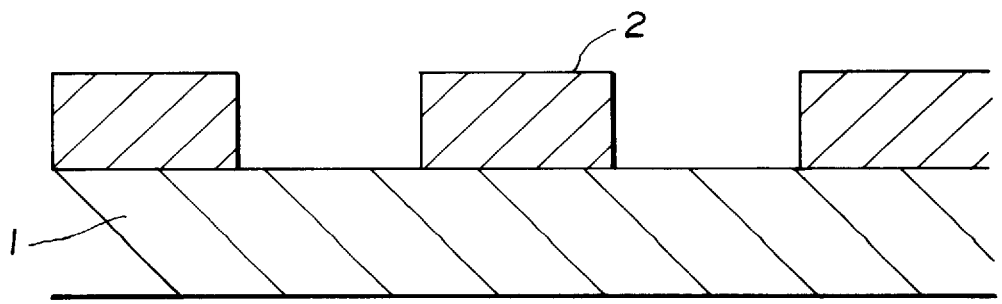

The micro-groove is configured to a rectangular or triangular geometry as shown in FIGS. 1 and 2. The dimensions of the micro-groove are as follows. In a profile of the resist layer constituting the resist pattern as shown in FIGS. 1 and 2, the resist layer has a line width of L $\mu$m and a thickness of T $\mu$m, and the micro-groove has an undercut height of A $\mu$m and an undercut depth of B $\mu$m. In one preferred embodiment, the resist layer has a thickness T of up to 20 $\mu$m and the micro-groove has an extent of undercut defined by the equations: $1/20 \leq A/T \leq 2/5$ and $1/10 \leq A/B \leq 2$, more preferably $1/10 \leq A/T \leq 1/5$ and $1/5 \leq A/B \leq 1$. If A/T is less than $1/20$, less undercut would render ineffective the stripping step in the lift-off technique. If A/T is more than $2/5$, the resist pattern would be broken from the root and flow away. If A/B is less than $1/10$, the resist pattern would be less adhesive to the substrate and readily flow away. If A/B is more than 2, the metal would deposit into the undercut to render difficult the resist stripping after metallization.

The resist composition used in this process is any desired one as long as a micro-groove as defined above can be formed in the resist layer. Of course, the positive resist composition according to the present invention is best suited for this process. Using the positive resist composition according to the invention, a micro-groove can be effectively formed to the geometry and size mentioned above. Although it was believed in the prior art that positive resist compositions which tend to generate micro-grooves are to be avoided, the present invention enables effective use of such a positive resist composition.

In using the positive resist composition according to the invention, it is effective to bake the resist film at a temperature of 100° to 130° C. before exposure or before development. The baking step ensures more effective formation of micro-grooves. The baking step may be done as a pre-baking step or a post-exposure baking step. If the baking temperature is lower than 100° C., no micro-grooves would be formed. Baking temperatures above 130° C. would render resist stripping difficult. The preferred baking temperature is 100° to 120° C.

EXAMPLE

Examples of the present invention are given below by way of illustration and not by way of limitation. All parts are by weight.

In each example, the resist was evaluated by the following tests.

(1) Weight average molecular weight Mw of alkali-soluble resin

It was measured by gel permeation chromatography using a GPC column set (two $G2000H_6$, three $G3000H_6$, and one $G4000H_6$ column, manufactured by Toyo Soda K.K.) and monodisperse polystyrene as the standard under the conditions: a flow rate of 1.5 ml/min., an eluting solvent tetrahydrofuran, and a column temperature of 40° C.

(2) Alkali solubility of alkali-soluble resin

An alkali-soluble resin was dissolved in ethyl cellosolve acetate (ECA) solvent to a solids content of 35%. The solution was coated onto a 6-inch silicon wafer at 2,000 rpm and softly baked on a hot plate at 90° C. for 90 minutes, obtaining a resin film of about 3 μm thick. The film was set in a development process monitor model PMS-601 (manufactured by Dai-Nihon Screen K.K.) where it was developed with 2.38% tetramethylammonium hydroxide (TMAH) and the time taken until the residual film became zero was measured. The alkali solubility is expressed by the initial film thickness divided by the film extinguish time, Å/sec.

(3) Degree of esterification

An OH value is defined as the molecular weight of the compound of formula (6) or (7) per phenolic OH group (which is given by dividing the molecular weight of the compound by the number of OH groups in a molecule). While the OH value is regarded as a phantom molecular weight per hydroxyl group, the proportion thereto of 1,2-quinonediazidosulfonyl group introduced therein is expressed by the moles of the initial charge.

(4) Resist film thickness

Using a spin coater Model SKW-636-BV (manufactured by Dai-Nihon Screen K.K.), a resist composition was coated on a HMDS-treated silicon wafer. The resist film was softly baked on a hot plate at 90° C. for 90 minutes and then measured for thickness by means of an optical film gage available under the tradename: Nanospec M210.

(5) Optimum exposure Eop

Exposure was made on a resist film by means of an i-ray (365 nm) exposure device model X/SR-1755i7A (manufactured by Nikon K.K., lens numerical aperture NA=0.50) while varying the exposure time. The resist was subject to paddle development using an aqueous solution of 2.38% tetramethylammonium hydroxide (TMAH) as a developer, rinsed with pure water, and spin dried. The optimum exposure Eop (sensitivity) is defined as the exposure energy required to form a 10-μm line-and-space pattern in a width ratio of 1:1 as observed under an electron microscope model S-4100 (manufactured by Hitachi K.K.).

Synthesis Example 1

Synthesis of Alkali-soluble Resin

A three-necked flask equipped with a stirrer, condenser and thermometer was charged with 64.9 g (0.60 mol) of p-cresol, 43.3 g (0.40 mol) of m-cresol, 44.6 g (0.55 mol) of an aqueous solution of 37 wt % formaldehyde, and 0.30 g ($2.4 \times 10^{-3}$ mol) of oxalic acid dihydrate as a polycondensation catalyst. The flask was immersed in an oil bath to maintain an internal temperature of 100° C. and polycondensation reaction took place for one hour.

At the end of reaction, 500 ml of methyl isobutyl ketone (MIBK) was added to the reaction solution which was stirred for 30 minutes. The aqueous layer was separated off. The MIBK layer in which the product was extracted was washed 5 times with 300 ml of pure water, followed by separation and vacuum stripping by means of an evaporator at 4 mmHg and 150° C. As a result, 87 g of a novolak resin A-1 was recovered.

Like novolak resin A-1, novolak resins A-2 through A-4 were synthesized using a phenol and formaldehyde as shown in Table 1.

TABLE 1

| Alkali soluble resin | Phenol (mol) | | | Formaldehyde (mol) | Yield (g) |
|---|---|---|---|---|---|
| | p-cresol | m-cresol | 3,5-xylenol | | |
| A-1 | 0.60 | 0.40 | — | 0.55 | 87 |
| A-2 | 0.25 | 0.55 | 0.25 | 0.60 | 91 |
| A-3 | 0.40 | 0.50 | 0.10 | 0.56 | 90 |
| A-4 | 0.50 | 0.50 | — | 0.70 | 92 |

Synthesis Example 2

Synthesis of 1,2-quinonediazido Compound

Under a light-shielded condition, a flask equipped with a stirrer, dropping funnel and thermometer was charged with 10.0 g (119 mmol) of a resorcinol derivative as shown in Table 2 and 24.0 g (89.2 mmol) of 1,2-naphthoquinonediazido-4-sulfonyl chloride in 200 g of 1,4-dioxane. The flask was immersed in a water bath to control its temperature below 25° C. To the flask, a solution of 10.50 g of 1,4-diazabicyclo[2.2.2]octane (DABCO) in 100 g of 1,4-dioxane as a catalyst was added dropwise through the dropping funnel. The precipitating DABCO hydrochloride salt was removed by filtration and the filtrate was added dropwise to 1,800 g of 0.12N hydrochloric acid for re-precipitation. The solution was subject to filtration again. The precipitate was extracted with 300 ml of ethyl acetate, washed 5 times with 100 g of pure water and separated. The solution was stripped by means of an evaporator below 40° C., obtaining 26 g of a 1,2-quinonediazido compound B-1.

Like 1,2-quinonediazido compound B-1, 1,2-quinonediazido compounds B-2 and B-3 were synthesized using a resorcinol derivative and 1,2-naphthoquinonediazido-4-sulfonyl chloride as shown in Table 2.

TABLE 2

| | Resorcinol derivative as a mother nucleus | | 1,2-quinonediazido-sulfonyl chloride | | |
|---|---|---|---|---|---|
| | Structure | Weight | Type | Weight | Yield |
| B-1 | (structure with resorcinol derivative, OH value = 84) | 10.0 g (119 mmol)* | 1,2-napthoquinone-diazido-4-sulfonyl chloride | 24.0 g (89.2 mmol) | 26.0 g |
| B-2 | (structure) | 10.0 g (130 mmol)* | 1,2-naphthoquinone-diazido-5-sulfonyl chloride | 35.0 g (130 mmol) | 41.0 g |
| B-3 | (structure) | 10.0 g (103 mmol)* | 1,2-naphthoquinone-diazido-5-sulfonyl chloride | 23.5 g (87.6 mmol) | 31.0 g |

*Mol is calculated provided that the OH value is a molecular weight.

Examples 1–10

A positive resist composition in solution form was prepared by adding a 1,2-quinonediazido compound, dissolution promoter and solvent to 80 parts of an alkali-soluble resin as shown in Table 3, mixing them to form a homogeneous solution, and passing the solution through a 0.2-$\mu$m membrane filter.

The resist solution was coated onto a 6-inch silicon wafer and softly baked at 90° C. for 90 minutes to form a resist film of 3.0 $\mu$m thick.

Next, the resist film was exposed to radiation (i-ray) at wavelength 365 nm through a reticle, subjected to post-exposure baking (PEB) at 120° C. for 90 seconds, developed, rinsed with pure water, and dried. The resulting resist was evaluated for various properties by the above-mentioned tests. A profile of 10-$\mu$m line-and-space pattern was evaluated in terms of undercut dimensions (height A and depth B) of a micro-groove as shown in FIGS. 1 and 2. The results are shown in Table 3.

TABLE 3

| | Alkali-soluble resin | | | 1,2-quinonediazido compound | | | Dissolution promoter | | Solvent | | | | |
|---|---|---|---|---|---|---|---|---|---|---|---|---|---|
| Example | Type | MW | Alkali solubility | Type | Esterification | Amount (part) | Type | Amount (part) | Type | Amount (part) | Optimum exposure Eop (mJ/cm$^2$) | A ($\mu$m) | B ($\mu$m) |
| 1 | A-1 | 2500 | 1000 Å/sec. | B-1 | 75% | 25 | C-3 | 25 | ECA | 260 | 180 | 0.55 | 0.75 |
| 2 | A-1 | 2500 | 1000 Å/sec. | B-2 | 100% | 25 | C-8 | 25 | ECA | 260 | 150 | 0.65 | 0.75 |
| 3 | A-1 | 2500 | 1000 Å/sec. | B-3 | 85% | 25 | C-17 | 25 | ECA | 260 | 180 | 0.50 | 1.20 |
| 4 | A-2 | 3500 | 400 Å/sec. | B-1 | 75% | 30 | C-25 | 22 | PGMEA | 260 | 220 | 0.40 | 0.50 |
| 5 | A-2 | 3500 | 400 Å/sec. | B-2 | 100% | 30 | C-29 | 35 | PGMEA | 290 | 150 | 0.75 | 3.20 |
| 6 | A-3 | 3000 | 800 Å/sec. | B-1 | 75% | 35 | C-34 | 22 | MMP | 274 | 280 | 0.50 | 1.50 |
| 7 | A-3 | 3000 | 800 Å/sec. | B-2 | 100% | 35 | C-34 | 30 | MMP | 280 | 260 | 0.35 | 2.20 |
| 8 | A-3 | 3000 | 800 Å/sec. | B-3 | 85% | 35 | C-34 | 35 | ECA | 300 | 250 | 0.75 | 3.80 |

TABLE 3-continued

| | Alkali-soluble resin | | | 1,2-quinonediazido compound | | | Dissolution promoter | | Solvent | | | | |
|---|---|---|---|---|---|---|---|---|---|---|---|---|---|
| Example | Type | MW | Alkali solubility | Type | Esterification | Amount (part) | Type | Amount (part) | Type | Amount (part) | Optimum exposure Eop (mJ/cm$^2$) | A ($\mu$m) | B ($\mu$m) |
| 9 | A-4 | 6500 | 200 Å/sec. | B-1 | 75% | 30 | C-3 | 25 | ECA | 280 | 220 | 0.40 | 0.75 |
| 10 | A-4 | 6500 | 200 Å/sec. | B-2 | 100% | 30 | C-3 | 30 | EL | 280 | 180 | 0.50 | 1.75 |

ECA: ethyl cellosolve
MMP: 3-methoxymethyl propionate
PGMEA: propylene glycol monomethyl ether acetate
EL: ethyl lactate It is evident from the results of Table 3 that when positive resist compositions within the scope of the invention are used, resist patterns in which micro-grooves are intentionally introduced are formed at high precision and reliability.

Examples 11–20

Using a vacuum evaporation chamber model EVD-500 (manufactured by Nichiden Aneruba K.K.), gold (Au) was deposited on each of the resist patterns formed in Examples 1–10 to a thickness of 5,000 Å. The structure was immersed in acetone solvent for 15 minutes and the resist film was stripped off. There was left a gold pattern which was visually observed for resist residues and gold fins under an electron microscope. All the samples were free of resist residues and gold fins.

Comparative Examples 1–4

A positive resist composition in solution form was prepared by adding a 1,2-quinonediazido compound, dissolution promoter and solvent to 80 parts of an alkali-soluble resin as shown in Table 4, mixing them to form a homogeneous solution, and passing the solution through a 0.2-$\mu$m membrane filter.

The resist solution was coated onto a 6-inch silicon wafer and softly baked at 90° C. for 90 minutes to form a resist film of 3.0 $\mu$m thick.

Next, the resist film was exposed to radiation (i-ray) at wavelength 365 nm through a reticle, subjected to post-exposure baking (PEB) at 120° C. for 90 seconds, developed, rinsed with pure water, and dried. The resulting resist was evaluated for various properties by the above-mentioned tests. The results are shown in Table 4. A profile of 10-$\mu$m line-and-space pattern was evaluated in terms of undercut dimensions (height A and depth B) of a micro-groove as shown in FIGS. 1 and 2. No micro-grooves had been formed.

Using a vacuum evaporation chamber model EVD-500, gold (Au) was deposited on each of the resist patterns to a thickness of 5,000 Å. The structure was immersed in acetone solvent for 15 minutes and the resist film was stripped off. The results are shown in Table 4. Resist stripping was impossible with some samples. Resist stripping was possible with the remaining samples, but resist residues were left and gold fins projected.

TABLE 4

| | Alkali-soluble resin | | | 1,2-quinonediazido compound | | | Dissolution promoter | |
|---|---|---|---|---|---|---|---|---|
| Comparative Example | Type | Mw | Alkali solubility | Type | Esterification | Amount (part) | Type | Amount (part) |
| CE1 | A-2 | 3500 | 400 Å/sec. | B-1 | 75% | 29 | — | — |
| CE2 | A-2 | 3500 | 400 Å/sec. | B-1 | 75% | 29 | C-25 | 5 |
| CE3 | A-2 | 3500 | 400 Å/sec. | B-1 | 50% | 30 | C-25 | 22 |
| CE4 | A-4 | 6500 | 200 Å/sec. | B-2 | 100% | 25 | C-3 | 8 |

| | Solvent | | Optimum | | | | | |
|---|---|---|---|---|---|---|---|---|
| Comparative Example | Type | Amount (part) | exposure Eop (mJ/cm$^2$) | A ($\mu$m) | B ($\mu$m) | Resist stripping | Resist residue | Gold fins |
| CE1 | PGMEA | 200 | 370 | 0 | 0 | NG | — | — |
| CE2 | PGMEA | 210 | 340 | 0 | 0 | OK | left | found |
| CE3 | PGMEA | 260 | 210 | 0 | 0 | OK | left | found |
| CE4 | EL | 260 | 230 | 0 | 0 | OK | left | found |

PGMEA: propylene glycol monomethyl ether acetate
EL: ethyl lactate

There have been described a positive resist composition and a conductor pattern forming method both of which can form a precise reliable wiring pattern by a lift-off technique.

Japanese Patent Application No. 164634/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A method for forming a conductor pattern by a lift-off technique comprising the steps of:

forming only one resist layer on one surface of a substrate, processing the resist layer to form a resist pattern, metallizing the substrate surface including the resist pattern, and stripping off the resist pattern to leave a pattern of metallization on the substrate, wherein said resist layer is formed from a positive resist composition comprising in admixture, (1) 80 parts by weight of an alkali-soluble novolak resin containing a recurring unit of the following general formula (1):

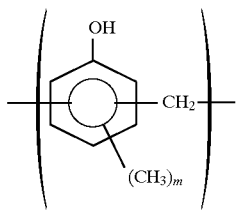

(1)

wherein m is an integer of 0 to 3, having a weight average molecular weight calculated as polystyrene of 2,000 to 10,000, (2) about 20 to 40 parts by weight of a low nucleus compound having a phenolic hydroxyl group and 2 to 5 benzene rings represented by one of the following general formulae (2) or (3):

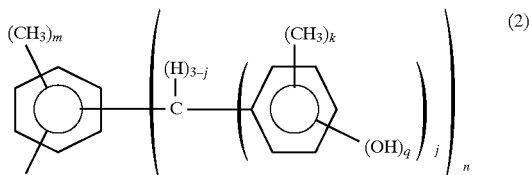

(2)

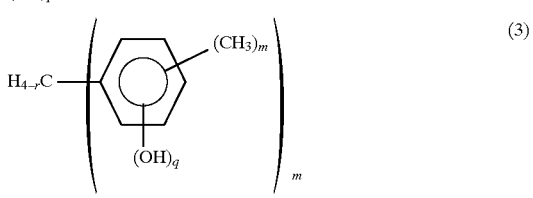

(3)

wherein j is 1 or 2, each of k, m and p is an integer of 0 to 3, n is an integer of 1 to 4, q is an integer of 1 to 3, r is an integer of 2 or 3, m+p+n≦6, and k+q≦5, as a dissolution promoter, and (3) about 15 to 60 parts by weight of a compound having a 1,2-naphthoquinonediazidosulfonyl group in a molecule represented by one of the following general formula (4) or (5), with a degree of esterification of at least 65%:

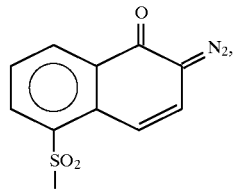

(4)

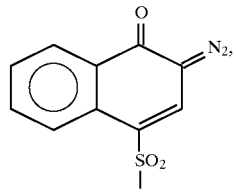

(5)

as a photosensitive agent, wherein the processing to form the resist layer comprises exposing the resist layer to light through a pattern and then developing the resist layer to form the resist pattern, and also baking the resist layer at a temperature of 100° to 130° C. before exposing the resist layer to light or before developing the resist layer, wherein said resist pattern is formed with a micro-groove in its surface joining the substrate so that a profile of said resist pattern has a line width of L $\mu$m and a thickness of T $\mu$m, and the micro-groove has a cut height of A $\mu$m and a cut depth of B $\mu$m, where T is 20 $\mu$m or less and extent of the microgroove is defined by the equations (I) and (II):

$$1/20 \leq A/T \leq 2/5 \qquad (I)$$

$$1/10 \leq A/B \leq 2 \qquad (II).$$

2. The method of claim 1, wherein said compound having a 1,2-naphthoquinonediazido group is one obtained by introducing 1,2-quinonediazidosulfonyl chloride into a ballast molecule of one of the following general formulae (6) or (7):

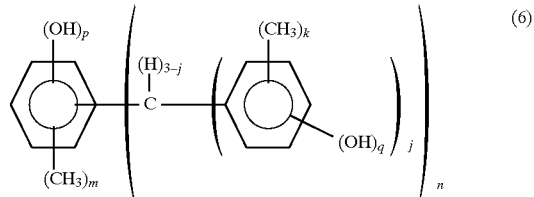

(6)

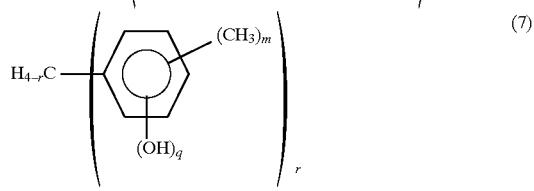

(7)

wherein j is 1 or 2, each of k, m and p is an integer of 0 to 3, n is an integer of 1 to 4, q is an integer of 1 to 3, r is an integer of 2 or 3, m+p+n≦6, k+q≦5, or trihydroxybenzophenone or tetrahydroxybenzophenone.

3. The method of claim 1, wherein the alkali-soluble novolak resin has a weight average molecular weight calculated as polystyrene of 3,000 to 7,000.

4. The method of claim 1, wherein the compound having a 1,2-naphthoquinonediazidosulfonyl group in a molecule has a degree of esterification of at least 75%.

5. The method of claim 1, wherein the metallizing is conducted with gold or tantalum metal.

6. The method of claim 1, wherein the metallizing is conducted by evaporation or sputtering.

7. The method of claim 1, wherein the microgroove has a rectangular or triangular geometry.

8. The method of claim 1, wherein the extent of the microgroove is defined by the following equations:

$$1/10 \leq A/T \leq 1/5$$

$$1/5 \leq A/B \leq 1.$$

9. The method of claim 1, wherein the resist layer is baked at a temperature of 100° C. to 120° C. before exposing the resist layer to light or before developing the resist layer.

10. The method of claim 1, wherein the baking is conducted post-exposure but before developing the resist layer.

* * * * *